US008373420B2

(12) United States Patent
Lupaczyk et al.

(10) Patent No.: US 8,373,420 B2
(45) Date of Patent: Feb. 12, 2013

(54) GROUND FAULT DETECTION

(75) Inventors: Gregg Lupaczyk, Shirley, MA (US); Normand Dontigny, Candiac (CA)

(73) Assignee: SimplexGrinnell LP, Westminster, MA (US)

( * ) Notice: Subject to any disclaimer, the term of this patent is extended or adjusted under 35 U.S.C. 154(b) by 477 days.

(21) Appl. No.: 12/533,828

(22) Filed: Jul. 31, 2009

(65) Prior Publication Data
US 2011/0025341 A1 Feb. 3, 2011

(51) Int. Cl.
*G01R 31/08* (2006.01)
(52) U.S. Cl. .......................... 324/509; 324/522
(58) Field of Classification Search ............ 324/509, 324/522
See application file for complete search history.

(56) References Cited

U.S. PATENT DOCUMENTS

| | | | |
|---|---|---|---|
| 3,899,717 A | 8/1975 | Legatti et al. ............... 317/18 |
| 4,412,193 A * | 10/1983 | Bienwald et al. ............ 335/18 |
| 4,521,824 A * | 6/1985 | Morris et al. ................ 361/45 |
| 5,061,911 A * | 10/1991 | Weidman et al. ............ 333/104 |
| 5,644,293 A | 7/1997 | Right et al. .................. 340/507 |
| 5,774,316 A * | 6/1998 | McGary et al. .............. 361/42 |
| 5,818,236 A * | 10/1998 | Sone et al. ................... 324/509 |
| 6,829,513 B2 | 12/2004 | Piersanti et al. ............. 700/83 |
| 6,907,300 B2 | 6/2005 | O'Mahoney et al. ......... 700/17 |
| 2004/0260812 A1* | 12/2004 | Rhodes et al. ............... 709/225 |
| 2006/0268898 A1 | 11/2006 | Karam ........................ 370/401 |
| 2008/0049458 A1 | 2/2008 | Pozzuoli et al. ............. 363/21.12 |
| 2009/0045818 A1 | 2/2009 | Male ........................... 324/509 |

* cited by examiner

*Primary Examiner* — Vincent Q Nguyen
(74) *Attorney, Agent, or Firm* — Brinks Hofer Gilson & Lione

(57) ABSTRACT

A ground fault detection system detects an earth fault or ground fault in a network device. The network device may be used in a fire alarm network. The ground fault detection system includes a power device that electrically isolates the ground fault detection system. A controller sequences a series of switches or relays to charge an energy storing element, such as a capacitor, with the isolated power supply. The capacitor is placed in communication with each port of the network device one at a time. If the connected port includes an inadvertent connection to ground, a detection circuit will detect the bias on the earth ground. The detection circuit may then output an indication of the inadvertent connection to ground to either a workstation or a fire alarm control panel.

21 Claims, 5 Drawing Sheets

GROUND FAULT DETECTION

BACKGROUND

Commercial fire alarm systems may include fire alarm control panels networked together or networked with other fire alarm equipment including terminals or workstations. The network utilized by the fire alarm control panel may be an Ethernet network as governed by the IEEE 802.3 standard. The 802.3 standard governs the physical layer (layer 1) and media access control (MAC) of the data link layer (layer 2) in Ethernet. Devices such as data switches, hubs, and routers, provide the nodes and infrastructure of the Ethernet. The 802.3 standard requires isolation between ground and the Ethernet cabling for safety and also isolation from port to port. Intentional direct current paths to ground from the Ethernet cabling are not permitted under the 802.3 standard.

The latest revision of the Standard for Control Units and Accessories for Fire Alarm Systems (UL 864, $9^{th}$ Edition) presently governs all fire alarm control panels and connected equipment. To comply with UL 864, devices used with a fire alarm control panel for control applications should be capable of reporting unintentional ground connections. Intentional paths to ground for monitoring for possible stray ground connections are acceptable.

What is needed is a ground fault detection device for use with a network device that is capable of detecting insufficient circuit impedance to ground.

SUMMARY OF INVENTION

The present embodiments relate to systems and methods of detecting ground faults. A ground fault may be an insufficient impedance to ground in a circuit. The ground fault detection system disclosed herein detects ground faults through the use of a switched capacitor. The capacitor is charged by and then switched onto a port of a network device to probe for a ground fault. The network device may be any device capable of communication on a network. For example, a network switch, a fire alarm control panel, and a computer workstation are examples of network devices.

A detection circuit is isolated from the rest of the device but connected to earth ground. If the port of the network device has a low impedance to earth ground, then the charge on the capacitor will flow to the detection circuit through earth ground. The current will flow through the earth ground and will affect a bias point on the detection circuit.

This process may be repeated by charging the capacitor for each of the ports of the network device. Each time the capacitor is placed in communication with one of the ports, the detection circuit identifies if the corresponding port includes an earth fault.

The present invention is defined by the following claims, and nothing in this section should be taken as a limitation on those claims. The preferred embodiments will now be described with reference to the attached drawings.

DETAILED DESCRIPTION

The present embodiments relate to systems and methods of detecting ground faults in a network device. The ground fault may be either a short or insufficient impedance inadvertently placed between any port of the network device and earth ground. A ground fault may be caused by moisture or condensation, oxidation, or other physical damage to a circuit. In other words, a ground fault may be an unintentional low impedance path to ground that allows more current than intended to flow to that part of the circuit.

The ground fault detection system disclosed herein detects ground faults through the use of multiple layers of electrical isolation, such as two layers of electrical isolation. A first layer of isolation is between the switch power and the earth fault detection circuitry. The earth fault detection circuitry may be connected to earth ground. A second layer of isolation may be provided by an energy storing element, such as a capacitor or an inductor. The energy storing element is switched onto the earth fault detection power supply and charged up (such as fully charged or charged to a predetermined amount), then switched off of the power supply. The voltage stored on the energy storing element may be used to probe Ethernet ports one at a time through a network of isolation relays. The isolation relays are controlled in such a way to guarantee that only one port at a time is connected. If one of the Ethernet ports is inadvertently connected to earth ground, the detection circuit will see a change in an earth ground referenced DC bias.

One possible application of a ground fault detection system is in a fire alarm system network. The network may include a ground fault detection system on the connection from workstation to workstation or on the connection from a workstation to a fire alarm control panel or another device. Some network devices, such as a network switch, a hub, or a router, manage the flow of data on the network.

A network switch may process and route data on the data link layer. A router may connect two subnets of the network and direct information in the network layer, which is layer 3 on the OSI model. A hub is a passive device on the network that forwards all information to one or more destinations. The network device may be a power over Ethernet (PoE) device configured to receive both power and data from the Ethernet.

The network may be embodied on 10BASE-T, 100BASE-T, or 1000BASE-T copper network. A suitable network device is the CRTLlink® EIS Series Switching Hub manufactured by Contemporary Controls of Downers Grove, Ill. However, the present embodiments may also be implemented in any device that manage the flow of data, such as a network switch, hub, or a router, as well as any device capable of communication on a network, such as a computer workstation or a fire alarm control panel.

Figure 1:
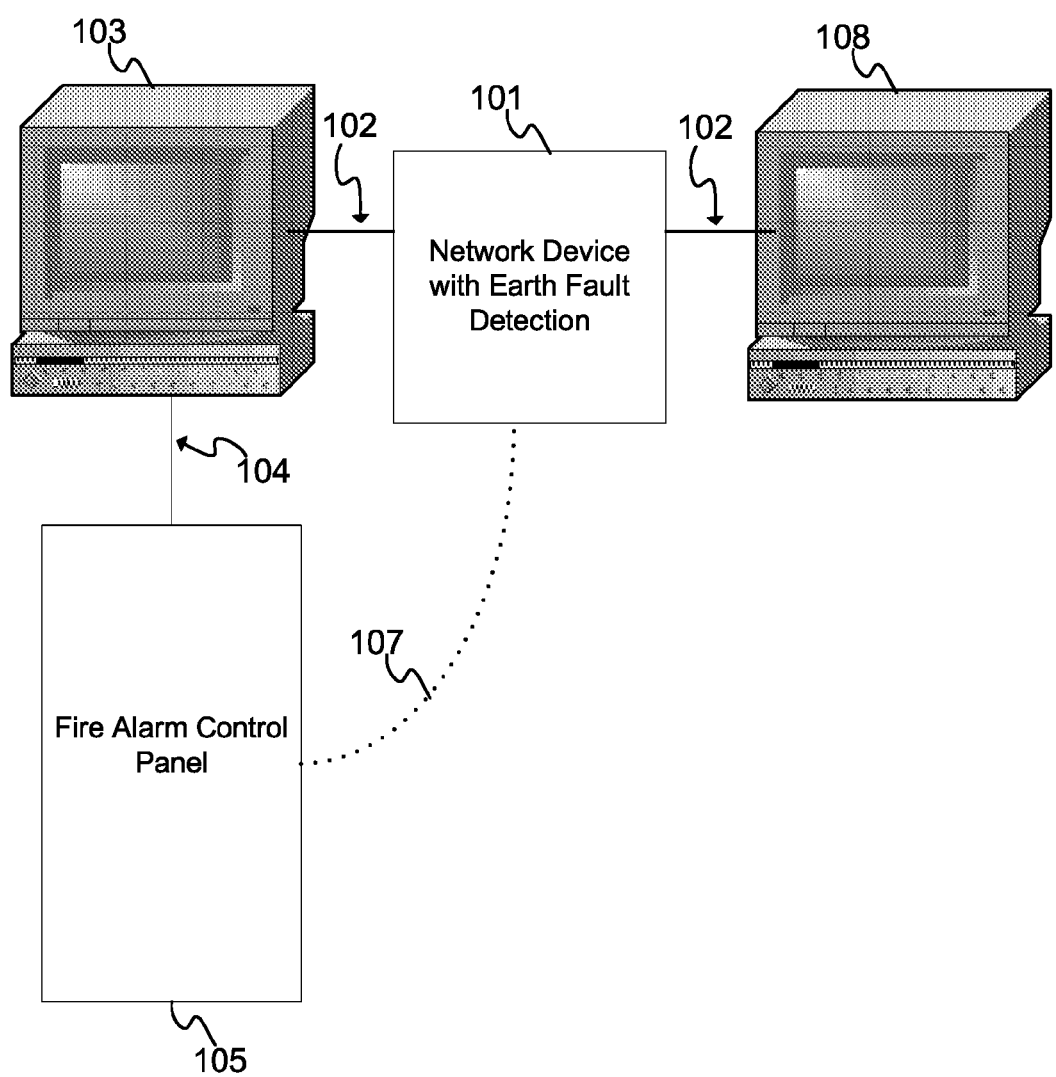
FIG. 1 illustrates a network including a ground fault detection system in one configuration.

FIG. 1 illustrates a network 100 including workstation 103, workstation 108, fire alarm control panel 105, and network device 101 including a ground fault detection system. The network device 101 may be coupled to the fire control panel 105 as part of a fire alarm system. As used herein, "coupled" includes directly connected or indirectly connected through one or more intermediary components.

Connection 104 between fire alarm control panel 105 to workstation 103, may be via Ethernet or another custom connection proprietary to fire alarm control panel 105. Connections 102 may be Ethernet connections supervised by the earth fault detection system. Connection 107 indicates that in one embodiment fire alarm control panel 105 may provide power to the network device 101, as well as the ground fault detection system. The power level of connection 107 may be a 24 V DC supply.

The fire alarm control panel 105 may monitor one or more detectors. The detectors may include fire detectors, smoke detectors, radiation detectors, heat detectors, carbon monoxide detectors, ozone detectors and/or other gas detectors, and may provide an indication of an alarm condition. The fire alarm control panel 105 may also monitor manual alarm triggers, such as a pull device, push button triggers, and glass break triggers. The fire alarm control panel 105 may include a user interface, memory, and microprocessor. The fire alarm control panel 105 may be implemented as software on a personal computer or as a standalone piece of hardware.

Figure 2:
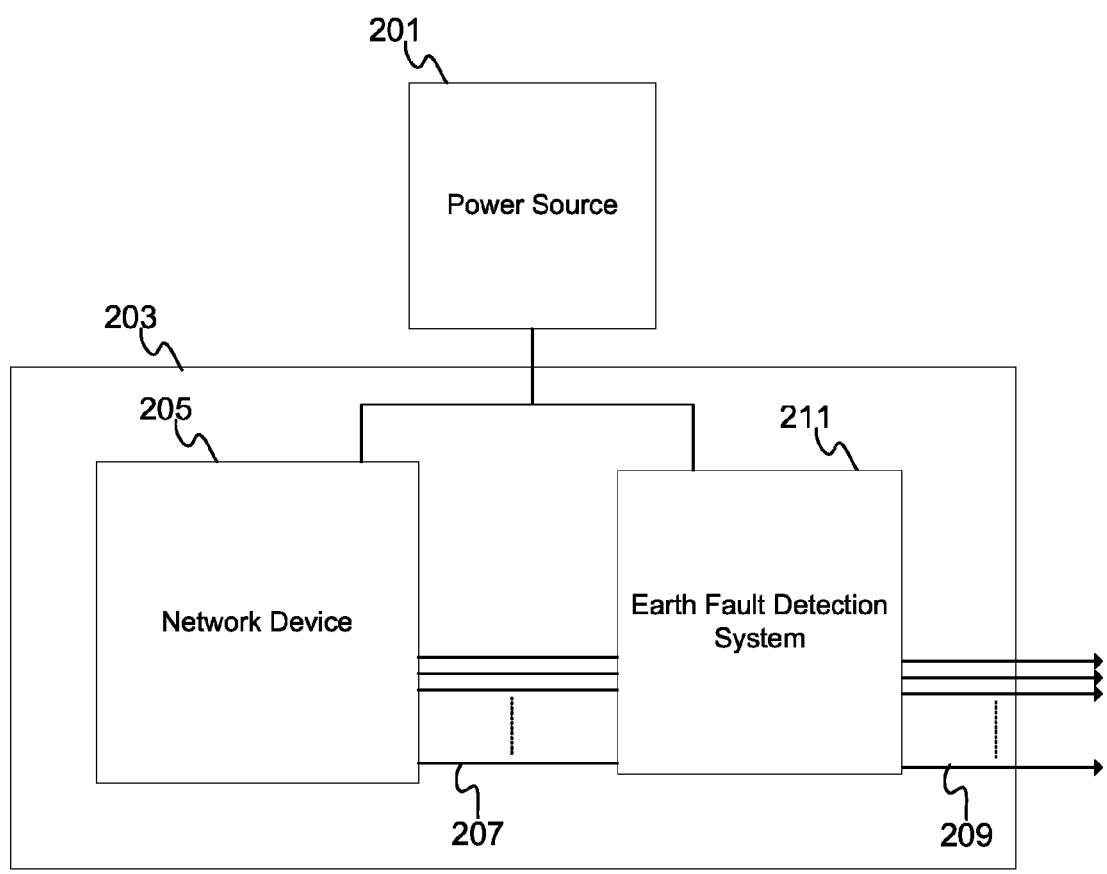
FIG. 2 illustrates a ground fault detection system in another configuration.

FIG. 2 illustrates one way the network device with ground fault detection system may be implemented. In FIG. 2, power source 201 supplies power to network device 205 as well as earth fault detection system 211. Chassis 203 supports network device 205 and earth fault detection system 211 as a single assembly. Chassis 203 may be formed of metal. Power source 201 may be a typical wall adapter including a transformer that converts AC power to DC power. Power source 201 may also be supplied by a fire alarm control panel, as shown by FIG. 1.

Figure 3:
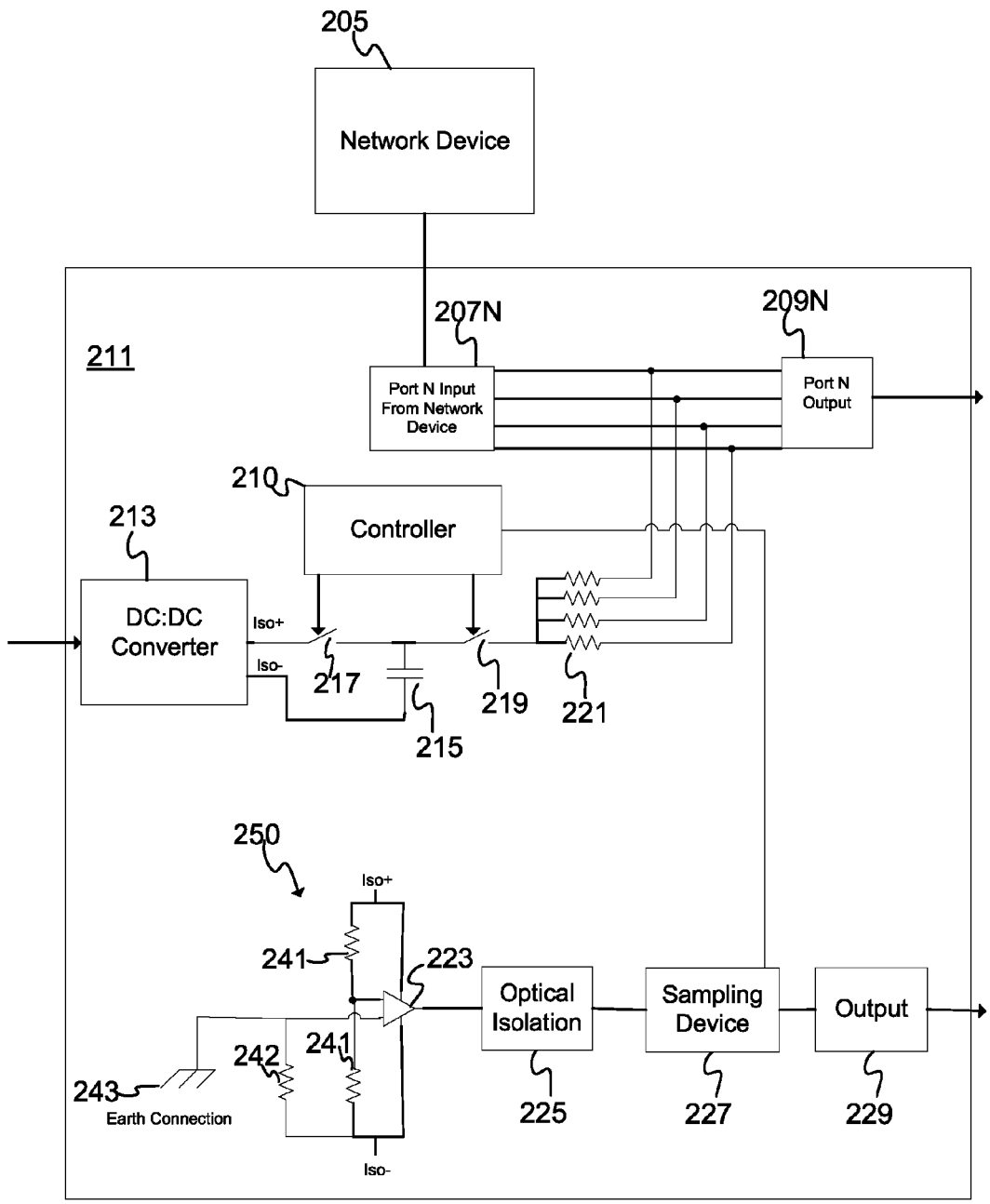
FIG. 3 illustrates a detailed view of the ground fault detection system of FIG. 2.

FIG. 3 illustrates a detailed view of the ground fault detection system of FIG. 2. Earth fault detection system 211 includes DC to DC converter 213 which receives an input voltage referenced to a system ground from power source 201. The output of DC to DC converter 213 is an output voltage (Iso+) isolated from the input voltage. DC to DC converter 213 provides the first layer of isolation, which is required to separate the detection circuit from power source 201. Other power devices capable of providing isolation between the power circuits may be substituted for the DC to DC converter.

The earth fault detection system 211 includes a number of input ports 207 each corresponding to a number of output ports 209. In one implementation, there are eight input ports 207 and eight output ports 209. Network device 205 is connected to the earth fault detection system 211 by way of input ports 207. Tested port 207N includes four wires, each of which is coupled to the earth fault detection system 211 through a resistor 221. Only tested port 207N is shown, but all ports from 1 to N may be connected to the earth fault detection system 211 in a manner similar to that shown for tested port 207N. A network of isolation relays is made up of relay 219 as well as a relay for each of ports 1 to N.

Controller 210 provides control signals to relay 217, relay 219, and sampling device 227. Controller 210 may be a Programmable Logic Device (PLD), an integrated circuit, or any hardware logic capable of performing the functions described. Further, the controller 210 could be implemented as software performed on a computer. Relay 217 and relay 219 may function as switches. Relay 217, in its first position, electrically connects capacitor 215 to the DC to DC converter 213 and electrically disconnects capacitor 215 to the DC to DC converter 213 in its second position. Controller 210 is configured to provide a first relay control signal that selects either the first position or second position for relay 217. Relay 219 electrically disconnects capacitor 215 and input ports 207 in a first position and electrically connects capacitor 215 and input ports 207 in a second position. Controller 210 is configured to provide a second relay control signal that selects either the first position or second position for relay 219.

In order to charge capacitor 215, controller 210 selects the first position for relay 217 and the first position for relay 219.

In order to test the tested output port 207N, controller 210 selects the second position for relay 217 and the second position for relay 219. At this time, the currently selected output port 207N is electrically connected to the test charge stored in capacitor 215. If port 207N is electrically connected to ground through a low impedance, then the test charge on capacitor 215 will have a path to earth ground, which indicates a ground fault. What constitutes a low impedance varies from application to application, but one example of an impedance between the port of a network device port and ground low enough to indicate an earth fault is 10 kΩ.

The detection circuit 250 monitors the currently selected output port 207N. As shown in FIG. 3, the detection circuit 250 is connected to earth ground 243. The detection circuit 250 creates a DC bias that is referenced to earth ground 243. If a ground fault occurs on selected output port 207N, there will be a path between the port 207N and earth ground 243. When capacitor 215 is placed across the selected output port 207N, the test charge will have a path to the detection circuit 250 through earth ground 243, which will cause the DC bias that is earth referenced to move.

Detection circuit 250 includes a comparator 223 and resistors 241. The resistors 241 create a voltage divider providing a predetermined input to comparator 223. The earth ground 243 is coupled to comparator 223 and also to the negative side of the isolated supply (Iso−) through resistor 242. When the earth referenced DC bias moves because of a ground fault, the comparator 223 can detect this change. By selecting values for resistors 241, a comparator can detect if the earth referenced DC bias moved by a predetermined amount. The values of resistors 241 may be selected to define the upper bound and/or lower bound.

On the other hand, if there is no ground fault in the selected output port 207N, the ground detection circuit 250 will remain isolated from the output port 207N and the test charge on capacitor 215, and the earth referenced DC bias will not move.

In order for the detection circuit 250 to remain isolated, an optical isolation device 225 receives the output of the comparator 223 and communicates the output using a optocoupler circuit or photocoupler circuit.

A sampling device 227 receives the isolated output from the optical isolation device 225. The results of the earth fault detection is meaningful only in the short amount of time after relay 219 connects capacitor 215 to port 207N. In one embodiment, controller 210 generates a control signal that coincides with the time relay 219 connects capacitor 215 to port 207N. The control signal activates sampling device 227. Sampling device 227 then samples and state latches the isolated output signal. Finally, communication output device 229 sends a signal indicative of the earth fault detection to a fire alarm control panel 105, which may communicate the output to one or more workstations. Alternatively, output device 229 may directly send the signal indicative of the earth fault detection to a workstation. The communication output device 229 may utilize a dry contact relay to convey the results of the earth fault detection circuit.

Figure 4:
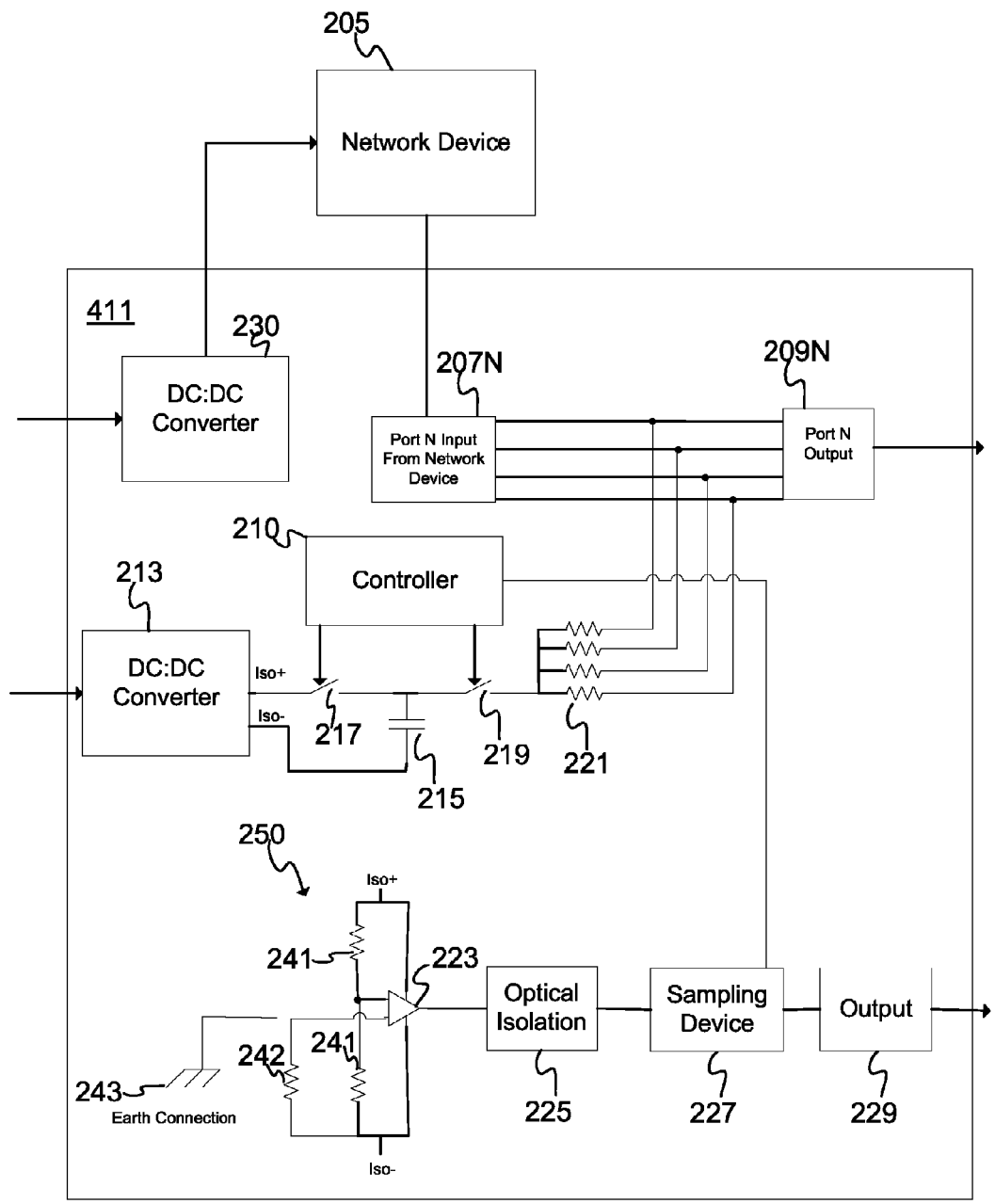
FIG. 4 illustrates a detailed view of another configuration of the ground fault detection system of FIG. 2.

FIG. 4 illustrates a detailed view of another configuration of the ground fault detection system of FIG. 2. All of the components and functions of the ground fault detection system 411 shown in FIG. 4 are similar to that of FIG. 3 except for DC to DC converter 230. Ground fault detection system 411 includes DC to DC converter 230 to supply power to network device 205. In this manner, a single power source may be utilized for the combined network device 205 and ground fault detection system 411.

In an alternative embodiment, the earth fault detection system 211 is connected to a port of the fire alarm control panel or the computer workstation directly. As used herein, the term "network device" includes any device capable of communication on a network and includes both fire alarm control panels and computer workstations.

Figure 5:
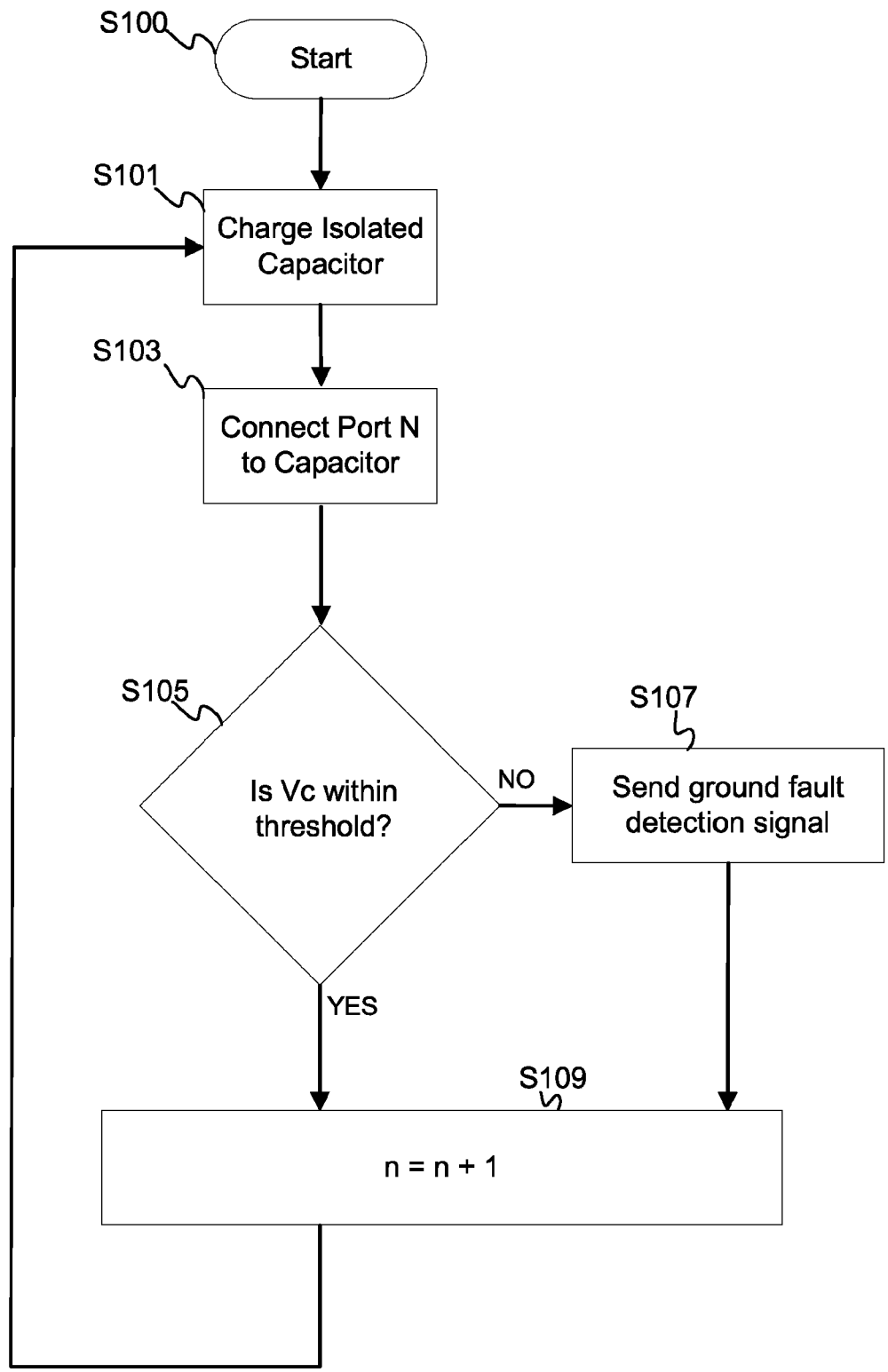
FIG. 5 is a flow chart of one exemplary operation of the systems of FIGS. 1-4.

FIG. 5 is a flow chart of one exemplary operation of the ground fault detection device. The operation begins at step S100. At step S101, the power device (DC to DC converter) is connected to the energy storing element 215 by isolation relay 217. In other words, the isolated capacitor is charged. The energy storing element 215 is then uncoupled from the power device by isolation relay 217 and coupled to a first port of the network device 205 by a relay in the relay network 219. In other words, port N is connected to the capacitor at step S103. If there is low impedance between the first port and earth ground, a bias point (Vc) sensed by the comparator in detection circuit 250 will move. At step S105, the detection circuit 250 determines whether bias point (Vc) is within a threshold range and at step S107, output device 229 sends ground fault detection signal to the fire alarm control panel or workstation. At step S109, the controller sets the tested port n=n+1. Steps S101-S109 are then repeated for each port of the network device 102.

Although specific embodiments of the invention have been described and illustrated, the invention is not to be limited to the specific forms or arrangements of parts so described and illustrated. The scope of the invention is to be defined by the claims appended hereto and their equivalents. It is intended that the foregoing detailed description be understood as an illustration of selected forms that the invention can take and not as a definition of the invention. It is only the following claims, including all equivalents that are intended to define the scope of this invention.

What is claimed is:

1. A ground fault detection system for detecting a ground fault in a network device, the ground fault detection system comprising:
    a power device configured to receive an input voltage referenced to a system ground and configured to supply an output voltage isolated from the input voltage;
    a first switch coupled to the power device to receive the output voltage;
    an energy storing element configured to be charged to at least a test charge from the output voltage when the first switch is in a first position and configured to be isolated from the power device when the first switch is in a second position;
    a second switch coupled to a port of the network device and configured to be selectively coupled to the energy storing device so that the port of the network device is not electrically connected to the energy storing element when the second switch is in a first position and electrically connected to the energy storing element when the second relay is in a second position; and
    a detection circuit configured to output an indication of the ground fault in the network device based on the test charge from the energy storing element when the second switch is in the second position;
    wherein the energy storing element is configured to:
        when the first switch is in the first position, be at least partly charged to a test charge from the output voltage independent of the ground fault; and
        when the first switch is in the second position, discharge at least a part of the test charge to an earth ground, dependent upon the ground fault.

2. The ground fault detection system of claim 1, wherein the indication of the ground fault is based on a change in an earth referenced DC bias.

3. The ground fault detection system of claim 1, wherein the power device comprises a DC to DC converter.

4. The ground fault detection system of claim 1, wherein the energy storing element comprises a capacitor.

5. The ground fault detection system of claim 1, wherein the energy storing element comprises a plurality of capacitors.

6. The ground fault detection system of claim 1, further comprising: a controller configured to command the first switch and the second switch.

7. The ground fault detection system of claim 6, wherein the port of the Ethernet network device is one of a plurality of ports of the network device.

8. The ground fault detection system of claim 7, wherein the second switch is an isolation relay included in a plurality of isolation relays, each isolation relay configured to couple and uncouple the detection circuit and the energy storing element from each port of the plurality of ports, and
    wherein the controller is configured to control the plurality of isolation relays so that one port of the plurality of ports is coupled to the detection circuit and the energy storing element at a first time period and another port of the plurality of ports is coupled to the detection circuit and the energy storing element at a second time period.

9. The ground fault detection system of claim 1, further comprising: an optical communication device configured to output the indication of the ground fault without disrupting the isolation of the detection circuit.

10. The ground fault detection system of claim 1, wherein the network device is an Ethernet switch on a fire alarm network including a fire alarm control panel and a workstation.

11. The ground fault detection system of claim 1, wherein the controller is further configured to generate a control signal for sampling the indication of the ground fault based on when the second switch connects the energy storing element to the port.

12. The ground fault detection system of claim 1, wherein the network device is a fire alarm control panel or a fire alarm workstation.

13. The ground fault detection system of claim 1, wherein the discharge of the test charge by the energy storing element is indicative of the ground fault.

14. A method of detecting a ground fault in a network device comprising:
    converting, with a power device, an input voltage referenced to a system ground to an output voltage isolated from the input voltage;
    supplying the output voltage to an energy storing element through a first switch when the first switch is in a first position;
    isolating the energy storing element from the power device when the first switch is in a second position;
    when the first switch is in the first position, charging the energy storing element from the output voltage to at least a test charge independent of the ground fault in the network device;
    connecting the energy storing element to a port of the network device through a second switch;
    when the first switch is in the second position, discharging at least part of the test charge to an earth ground dependent upon the ground fault; and outputting, from a detection circuit, an indication of the earth fault in the port of the network device based on the test charge from the energy storing element.

15. The method of claim 14, wherein the indication of the ground fault is based on a change in an earth referenced DC bias.

16. The method of claim 14, wherein the power device comprises a DC to DC converter.

17. The method of claim 14, wherein the energy storing element comprises a capacitor.

18. The method of claim 14, further comprising: isolating the detection circuit using an optical communication device.

19. The method of claim 14, wherein the network device is an Ethernet switch on a fire alarm network including a fire alarm control panel and a workstation.

20. The method of claim 14, further comprising:
generating a control signal for sampling the indication of the ground fault based on when the second switch connects the energy storing element to the port.

21. A method of detecting a ground fault comprising:
converting an input voltage referenced to a system ground to an output voltage isolated from the input voltage;
supplying the output voltage to an energy storing element through a first switch;
storing a test charge with the energy storing element;
connecting the energy storing element to a port of the network device through a second switch;
outputting an indication of an earth fault in the port of the network device based on the test charge from the energy storing element;
connecting the energy storing element to a second port of the network device using a third switch; and
outputting an indication of an earth fault in the second port of the network device based on the test charge from the energy storing element.

* * * * *